(12) United States Patent
Van Der Wijst et al.

(10) Patent No.: US 9,696,630 B2
(45) Date of Patent: Jul. 4, 2017

(54) LITHOGRAPHIC APPARATUS AND DEVICE MANUFACTURING METHOD

(71) Applicants: ASML Netherlands B.V., Veldhoven (NL); Carl Zeiss SMT GmbH, Oberkochen (DE)

(72) Inventors: Marc Wilhelmus Maria Van Der Wijst, Veldhoven (NL); Hans Butler, Best (NL); Erik Roelof Loopstra, Eindhoven (NL); Bernhard Geuppert, Aalen (DE); Marco Hendrikus Hermanus Oude Nijhuis, Eindhoven (NL); Rodolfo Guglielmi Rabe, Aalen (DE); Yim Bun Patrick Kwan, Aalen (DE); Dick Antonius Hendrikus Laro, Breda (NL)

(73) Assignees: ASML Netherlands B.V., Veldhoven (NL); Carl Zeiss SMT GMBH, Oberkochen (DE)

(*) Notice: Subject to any disclaimer, the term of this patent is extended or adjusted under 35 U.S.C. 154(b) by 0 days.

(21) Appl. No.: 14/852,952

(22) Filed: Sep. 14, 2015

(65) Prior Publication Data

US 2016/0004170 A1  Jan. 7, 2016

Related U.S. Application Data

(63) Continuation of application No. 13/301,712, filed on Nov. 21, 2011, now Pat. No. 9,134,632.

(Continued)

(51) Int. Cl.
*G03F 7/20* (2006.01)
*F16F 15/02* (2006.01)
*F16F 15/08* (2006.01)

(52) U.S. Cl.
CPC ........ *G03F 7/70141* (2013.01); *F16F 15/022* (2013.01); *F16F 15/08* (2013.01); *G03F 7/708* (2013.01); *G03F 7/709* (2013.01)

(58) Field of Classification Search
None
See application file for complete search history.

(56) References Cited

U.S. PATENT DOCUMENTS 5,684,566 A  11/1997  Stanton
5,823,307 A  10/1998  Schubert et al.
(Continued)

FOREIGN PATENT DOCUMENTS

EP  1 643 543 A1  4/2006
EP  1 669 805 A2  6/2006
(Continued)

OTHER PUBLICATIONS

English-Language Abstract for Japanese Patent Publication No. 04-347321 A, published Dec. 2, 1992; 1 page.
(Continued)

*Primary Examiner* — Steven H Whitesell Gordon
(74) *Attorney, Agent, or Firm* — Sterne, Kessler, Goldstein & Fox P.L.L.C.

(57) ABSTRACT

Lithography apparatus and device manufacturing methods are disclosed in which means are provided for reducing the extent to which vibrations propagate between a first element of a projection system and a second element of a projection system. Approaches disclosed include the use of plural resilient members in series as part of a vibration isolation system, plural isolation frames for separately supporting first and second projection system frames, and modified connection positions for the interaction between the first and second projection system frames and the isolation frame(s).

20 Claims, 10 Drawing Sheets

Related U.S. Application Data

(60) Provisional application No. 61/425,391, filed on Dec. 21, 2010.

(56) References Cited

U.S. PATENT DOCUMENTS

| | | |
|---|---|---|
| 6,193,206 B1 | 2/2001 | Yasuda et al. |
| 6,283,041 B1 | 9/2001 | Ono |
| 6,327,024 B1 | 12/2001 | Hayashi et al. |
| 6,378,672 B1 | 4/2002 | Wakui |
| 6,420,716 B1 | 7/2002 | Cox et al. |
| 6,441,884 B1 | 8/2002 | Takahashi et al. |
| 6,864,988 B2 | 3/2005 | Hof et al. |
| 7,463,334 B2 | 12/2008 | Tokuda |
| 7,554,105 B2 | 6/2009 | Franken et al. |
| 7,619,715 B2 | 11/2009 | Ono et al. |
| 7,817,243 B2 | 10/2010 | Heertjes et al. |
| 7,907,326 B2 | 3/2011 | Uchida |
| 8,044,373 B2 | 10/2011 | Butler |
| 8,300,208 B2 | 10/2012 | Loopstra et al. |
| 8,400,613 B2 | 3/2013 | Ishikawa |
| 8,708,115 B2 | 4/2014 | Herold et al. |
| 8,730,451 B2 | 5/2014 | Butler et al. |
| 9,134,632 B2 | 9/2015 | Van Der Wijst et al. |
| 2002/0075574 A1 | 6/2002 | Sorg et al. |
| 2002/0149754 A1 | 10/2002 | Auer et al. |
| 2003/0197914 A1* | 10/2003 | Cox ............... G03F 7/70141 355/53 |
| 2005/0018160 A1 | 1/2005 | Dams et al. |
| 2005/0063288 A1 | 3/2005 | Nawata et al. |
| 2006/0272910 A1 | 12/2006 | Kraner |
| 2008/0237947 A1 | 10/2008 | Warmerdam et al. |
| 2008/0285161 A1 | 11/2008 | Geuppert et al. |
| 2009/0033895 A1* | 2/2009 | Binnard ............ G03F 7/709 355/53 |
| 2009/0091725 A1 | 4/2009 | Van Der Wijst et al. |
| 2009/0147230 A1 | 6/2009 | Butler et al. |
| 2010/0053589 A1 | 3/2010 | Hashemi et al. |
| 2010/0089712 A1 | 4/2010 | Butler et al. |
| 2010/0157264 A1 | 6/2010 | Butler et al. |
| 2010/0238424 A1 | 9/2010 | Van Empel et al. |
| 2011/0317140 A1 | 12/2011 | Sigel et al. |
| 2012/0154774 A1 | 6/2012 | Van Der Wijst et al. |

FOREIGN PATENT DOCUMENTS

| | | |
|---|---|---|
| EP | 1 174 769 B1 | 12/2006 |
| EP | 1 796 144 A1 | 6/2007 |
| EP | 2 128 700 A1 | 12/2009 |
| JP | 04-347321 A | 12/1992 |
| JP | 11-154698 A | 6/1999 |
| JP | 2004-092112 A | 3/2004 |
| JP | 2006-147989 A | 6/2006 |
| JP | 2007-316132 A | 12/2007 |
| JP | 2010-219558 A | 9/2010 |
| KR | 10-2009-0034782 A | 4/2009 |
| WO | WO 02/29277 A1 | 4/2002 |
| WO | WO 2006/084657 A1 | 8/2006 |
| WO | WO 2010/031754 A1 | 3/2010 |
| WO | WO 2010/083965 A1 | 7/2010 |

OTHER PUBLICATIONS

English-Language Abstract for International Patent Publication No. 2002/029277 A1, published Apr. 11, 2002; 1 page.
English-Language Abstract for Japanese Patent Publication No. 2004-092112 A, published Mar. 25, 2004; 1 page.
English-Language Abstract for Japanese Patent Publication No. 2006-147989 A, published Jun. 8, 2006; 1 page.
English-Language Abstract for European Patent Publication No. 2 128 700 A1, published Dec. 2, 2009; 1 page.
Machine translation of JP2004-092112, Mar. 2004.
Machine translation of WO 02/29277, Apr. 2002.

* cited by examiner

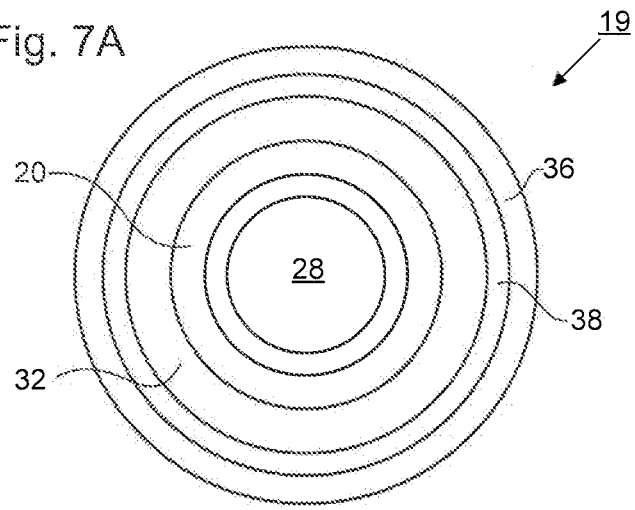
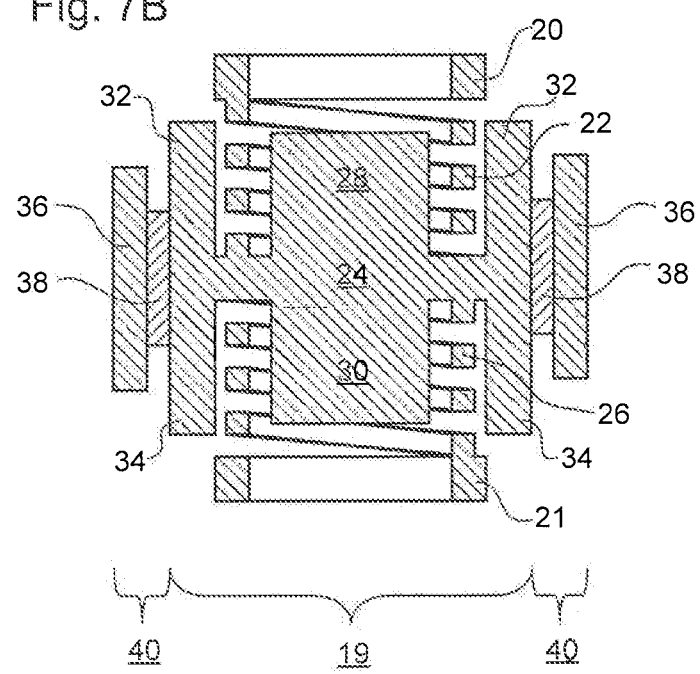

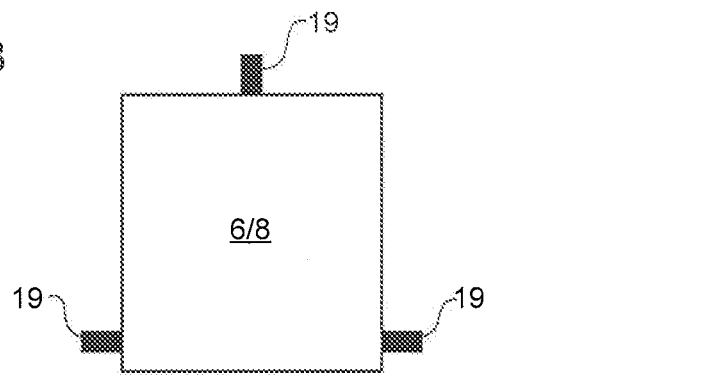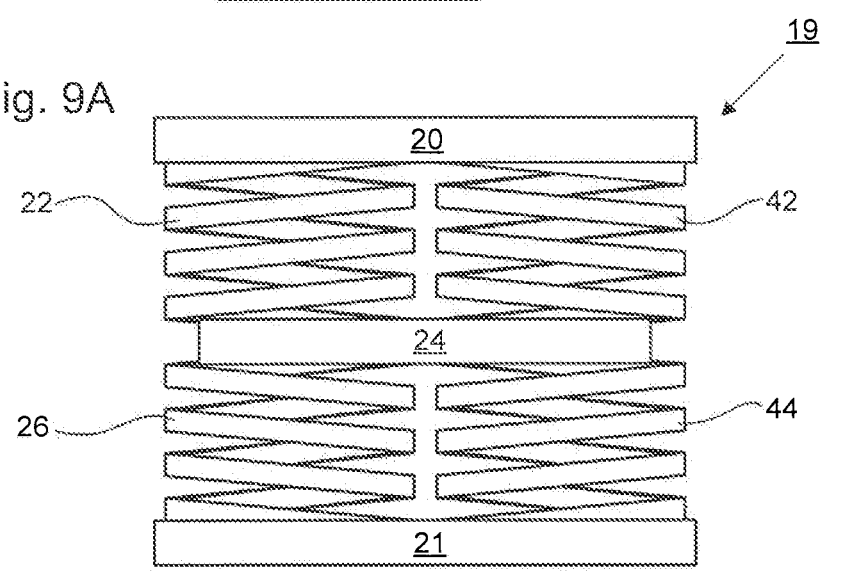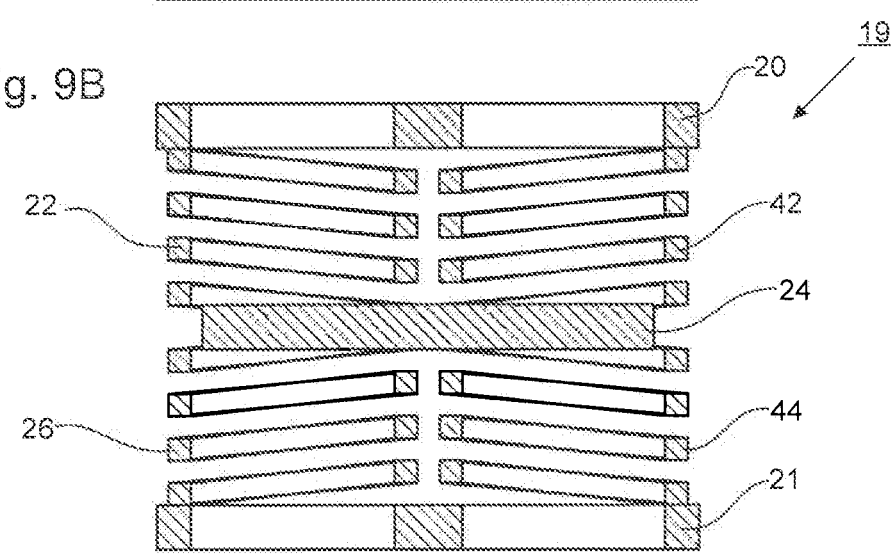

LITHOGRAPHIC APPARATUS AND DEVICE MANUFACTURING METHOD

This application incorporates by reference in their entireties U.S. Non-Provisional patent application Ser. No. 13/301,712 and U.S. Provisional Patent Application No. 61/425,391.

BACKGROUND

Field of the Present Invention

The present invention relates to a lithographic apparatus and a method for manufacturing a device.

Related Art

Lithography is widely recognized as a key process in manufacturing integrated circuits (ICs) as well as other devices and/or structures. A lithographic apparatus is a machine, used during lithography, which applies a desired pattern onto a substrate, such as onto a target portion of the substrate. During manufacture of ICs with a lithographic apparatus, a patterning device (which is alternatively referred to as a mask or a reticle) generates a circuit pattern to be formed on an individual layer in an IC. This pattern may be transferred onto the target portion (e.g., comprising part of, one, or several dies) on the substrate (e.g., a silicon wafer). Transfer of the pattern is typically via imaging onto a layer of radiation-sensitive material (e.g., resist) provided on the substrate. In general, a single substrate contains a network of adjacent target portions that are successively patterned. Manufacturing different layers of the IC often requires imaging different patterns on different layers with different reticles. Therefore, reticles must be changed during the lithographic process.

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

A projection system is provided for carrying out the final stage of the imaging of the pattern onto the layer of radiation-sensitive material by projecting a patterned radiation beam from the patterning device to the substrate. The projection system comprises various elements, referred to below as "radiation-adjusting elements", which are capable of interacting with a radiation beam in order to alter the properties thereof. The overall configuration of these elements defines how the projection system operates.

One or more of the radiation-adjusting elements may be provided with an actuator for adjusting the state of the element, for example its position, shape and/or orientation. The projection system elements may be reflective (e.g., a mirror) or transmissive (e.g., a lens), for example.

A sensor may be provided for measuring the state of a given radiation-adjusting element. The sensor may measure the position, shape and/or orientation of the radiation-adjusting element, for example. The actuator for the radiation-adjusting element may be configured to operate by reference to the output from the sensor, for example by means of a control loop.

Means may be provided for mechanically isolating certain radiation-adjusting elements from certain other elements of the lithography apparatus. The mechanical isolation may inhibit (reduce) propagation of vibrations, for example. The mechanical isolation may isolate an actuator for a given radiation-adjusting element from a corresponding sensor for measuring the state of that element, for example.

Despite the presence of these mechanical isolation means, some vibrations may still propagate between elements of the projection system that are nominally "isolated" by these means, thus leading to a reduction in performance of the projection system. In the case where vibrations propagate between an actuator for a given radiation-adjusting element and a corresponding sensor for measuring the state of that element, for example, the performance of the sensor (affecting overlay accuracy for example) and/or the performance of control systems that use the sensor output (affecting throughput because of reduced stability and/or longer setpoint convergence times for example) may be reduced.

SUMMARY

It is desirable to improve the mechanical isolation between elements of the projection system.

According to an aspect of the present invention, there is provided a lithography apparatus comprising a projection system configured to project a patterned radiation beam onto a target portion of a substrate, the projection system comprising a first element and a second element, a first vibration isolation system for inhibiting propagation of vibrations between the first element and the second element, the first vibration isolation system comprising a resilient portion comprising a first resilient member, a first internal mass and a second resilient member, arranged respectively to act in series.

According to an alternative aspect of the present invention, there is provided a lithographic apparatus comprising a projection system configured to project a patterned radiation beam onto a target portion of a substrate, a first projection system frame for supporting a first portion of the projection system, a second projection system frame for supporting a second portion of the projection system, an isolation frame for supporting at least one of the first and second projection system frames, a first vibration isolation system configured to support the first projection system frame via the isolation frame and to inhibit propagation of vibrations from the first projection system frame to the isolation frame. The first vibration isolation system is configured to engage with the isolation frame at a position that is nearer to a horizontal plane containing the center of mass of the isolation frame than to a plane containing the centre of mass of the first projection system frame.

According to another alternative aspect of the present invention, there is provided a device manufacturing method comprising projecting a patterned beam of radiation onto a substrate, comprising providing a projection system having a first element and a second element, and using a first vibration isolation system to inhibit propagation of vibrations between the first element and the second element, the first vibration isolation system comprising a resilient portion comprising a first resilient member, a first internal mass and a second resilient member, arranged respectively to act in series.

According to an still further alternative aspect of the present invention, there is provided a device manufacturing method comprising projecting a patterned beam of radiation onto a substrate using a projection system, comprising supporting a first portion of the projection system using a first projection system frame, supporting a second portion of the projection system using a second projection system frame, supporting the first and second projection system frames using an isolation frame, supporting the first projection system frame using a first vibration isolation system via the isolation frame and inhibiting propagation of vibrations from the first projection system frame to the isolation frame. The first vibration isolation system is configured to engage with the isolation frame at a position that is nearer to a horizontal plane containing the center of mass of the isolation frame than to a plane containing the centre of mass of the first projection system frame.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the present invention and to enable a person skilled in the relevant art(s) to make and use the present invention.

FIGS. 7A and 7B depict, in top view and side sectional view respectively, a resilient portion of a vibration isolation system similar to that of FIGS. 6A and 6B except that a damping mass is provided radially outside of the exterior portion of the internal mass.

FIG. 8 depicts a projection system frame with three anisotropic resilient portions deployed around its periphery.

FIGS. 9A and 9B depict, in side view and side sectional view respectively, an anisotopic resilient portion comprising two series of resilient member-internal mass-resilient member connected together so as to act in parallel.

Figure 10A:
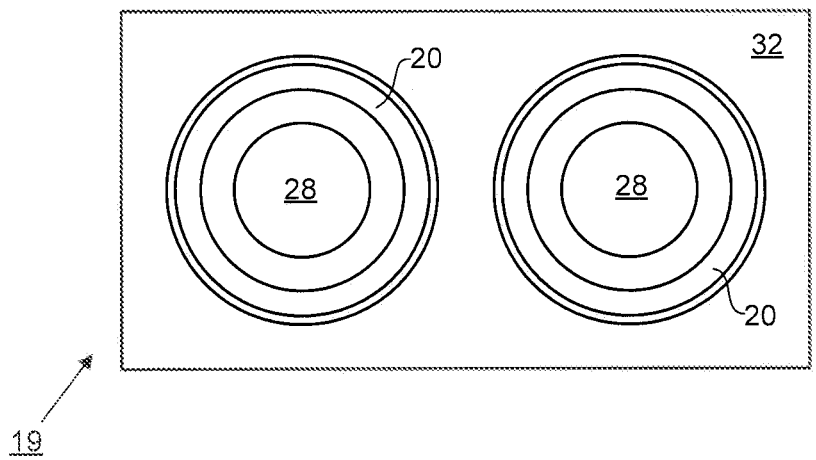
Figure 10B:
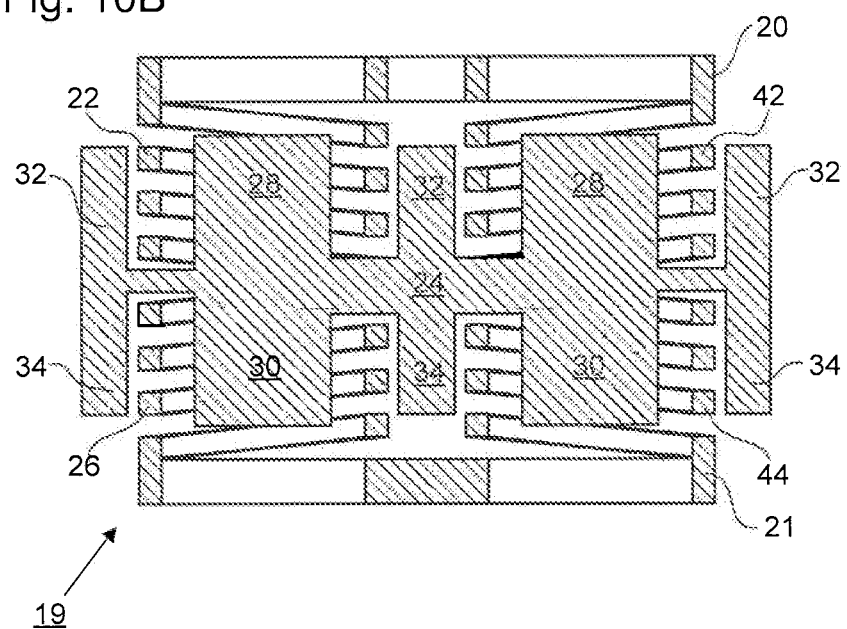

FIGS. 10A and 10B depict, in top view and side sectional view respectively, an anisoptropic resilient portion in which a single integral internal mass is provided having interior portions extending within all four of the resilient members and an outer portion that forms a continuous closed loop around the outside of the two series of resilient members and in between the two series of resilient members.

Figure 2:
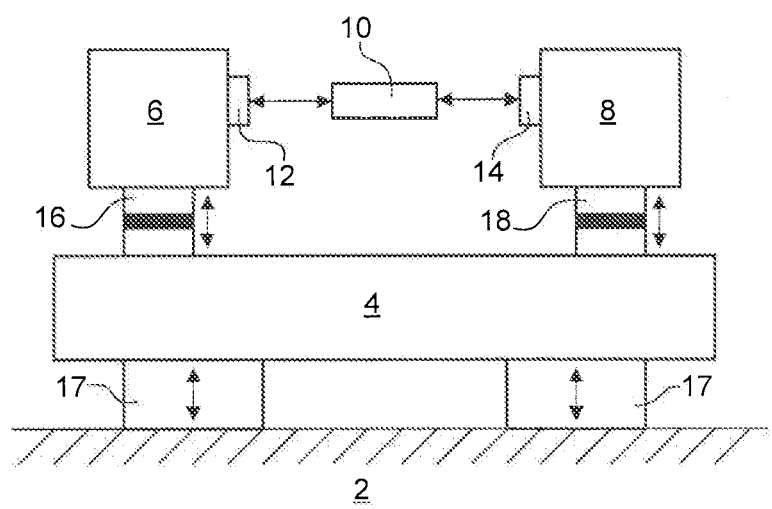
FIG. 2 depicts an arrangement comprising first and second projection system frames, an isolation frame and a base frame, with vibration isolation systems configured to act between each of the first and second projection system frames and the isolation frame.
Figure 11:
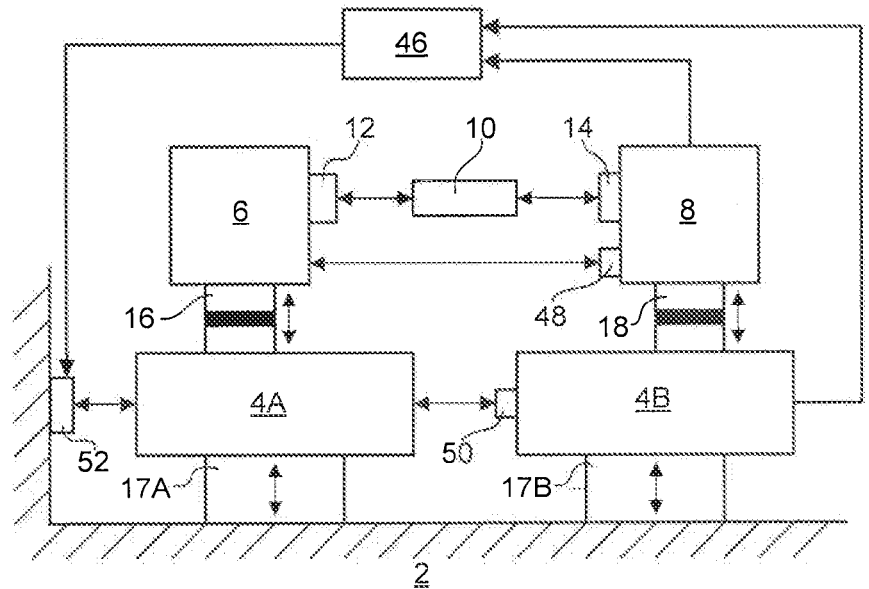

FIG. 11 depicts an arrangement similar to that of FIG. 2 except that the isolation frame is split into two isolation frames and a control system is provided for controlling the relative positions of the two isolation frames.

Figure 12:
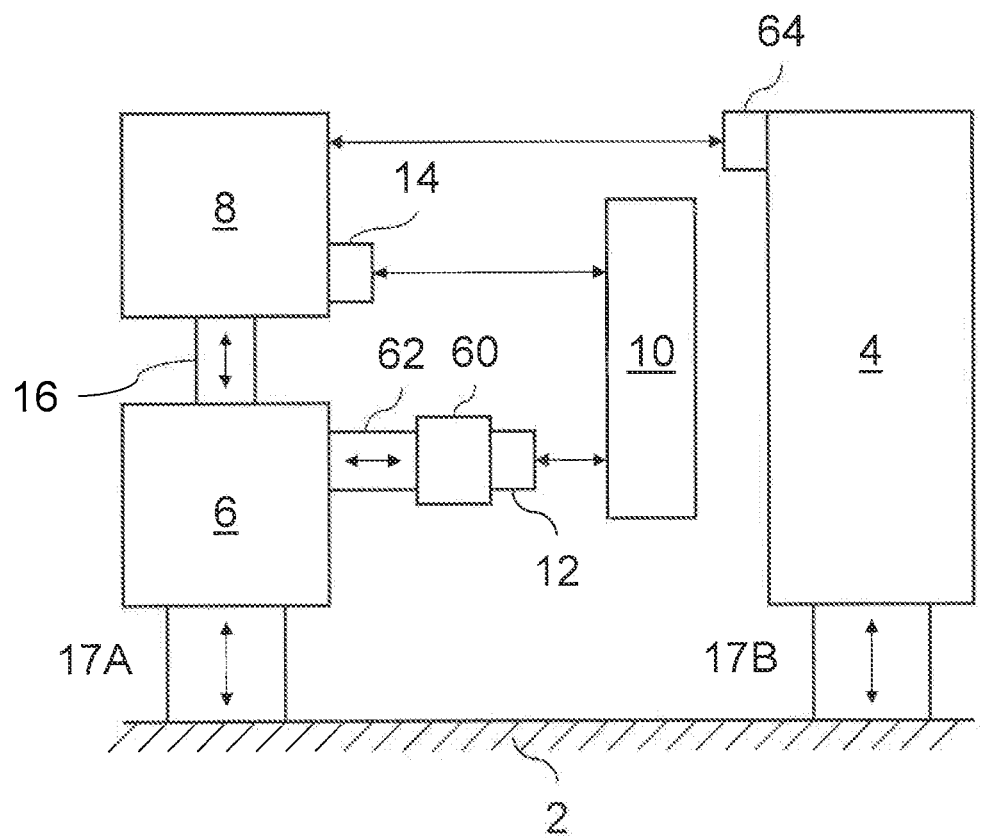

FIG. 12 depicts an alternative arrangement wherein the first and second projection frames are provided with a first vibration isolation system while the isolation frame is provided with a second vibration isolation system.

Figure 13A:
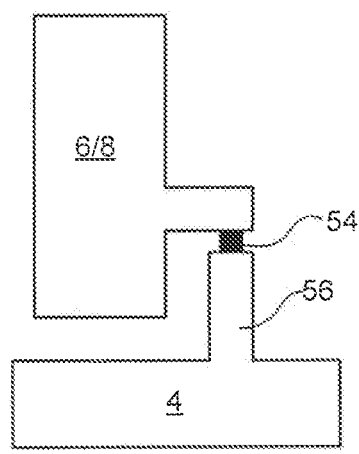
Figure 13B:
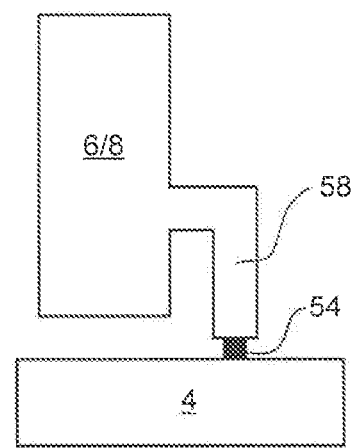

FIGS. 13A and 13B illustrate connection of a projection system frame to an isolation frame at different heights.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Figure 1:
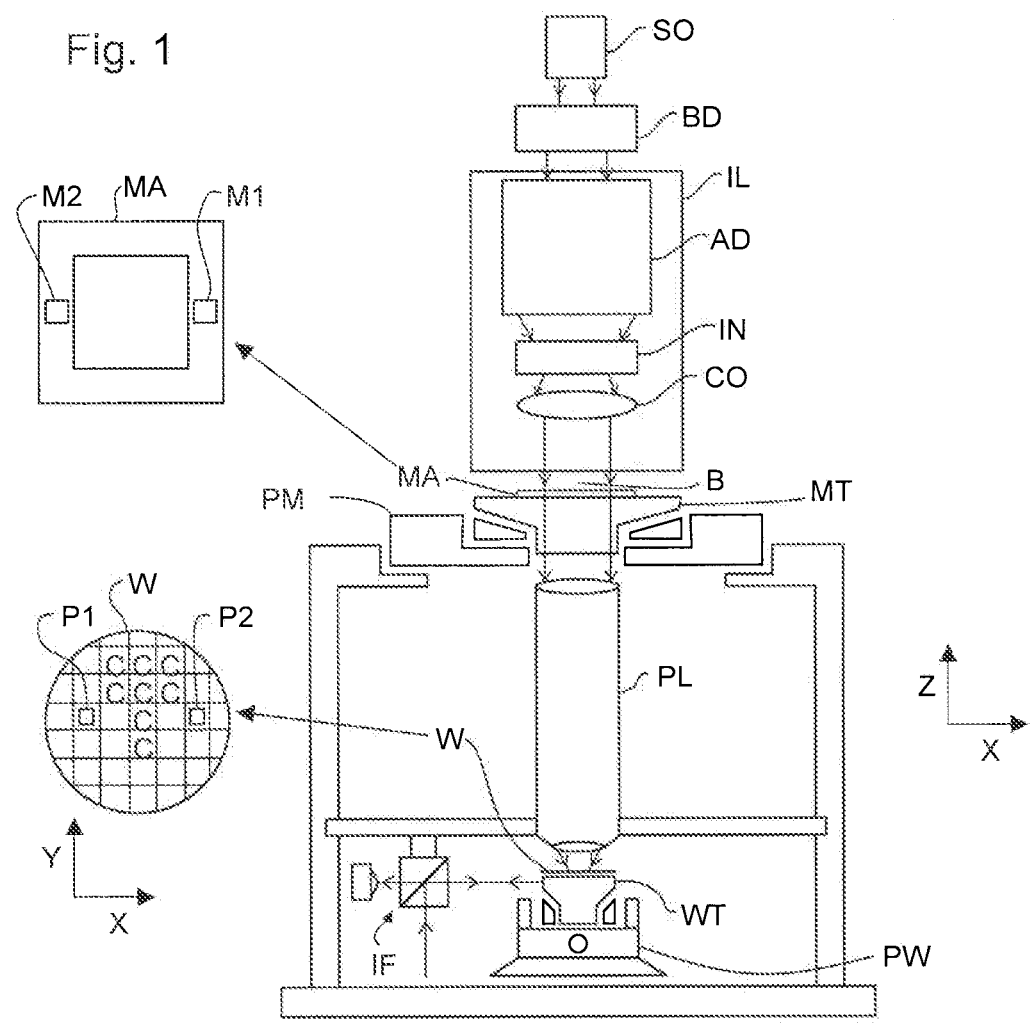
FIG. 1 depicts a lithographic apparatus according to an embodiment of the present invention.

FIG. 1 schematically depicts a lithographic apparatus according to one embodiment of the present invention. The apparatus comprises an illumination system (illuminator) IL configured to condition a radiation beam B (e.g., UV radiation or DUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In the discussion below, reference is made to a Cartesian coordinate system in which the Z-axis corresponds to the axis perpendicular to the substrate W when the substrate W is being exposed, and the X- and Y-axes define the plane perpendicular to the Z-axis. Rotations about the X-, Y-, and Z-axes are referred to as Rx, Ry and Rz respectively.

FIG. 2 is a schematic side view of a portion of a lithography device. A first projection system frame 6 and a second projection system frame 8 are supported by an isolation frame 4 via vibration isolation systems 16 and 18. The vibration isolation systems 16/18 may have the same structure as each other, or different structures. In general, each vibration isolation system 16/18 will comprise at least one resilient portion that is configured to deform elastically and at least one damping portion that dissipates energy associated with deformation of the resilient portion(s). The damping portion(s) may be "active", with a control system that transforms a measured position quantity (e.g., by means of an accelerometer) of one of the frames into a force acting on one of the frames, in order to improve the damping performance compared to a passive form of damping.

In the embodiment shown in FIG. 2, the vibration isolation systems 16 and 18 are shown as single units, but they could comprise a plurality of units, for example a plurality of resilient portions and/or a plurality of damping portions. An example of such an arrangement is shown in FIG. 8 and described below.

The isolation frame 4 is supported by a base frame 2, which is configured to be mounted to the floor of the installation site of the lithography apparatus. An isolation frame-base frame vibration isolation system 17 may be provided to isolate the isolation frame 4, and thus all elements mounted on the isolation frame 4, from vibrations originating from the installation site and from other elements of the lithography apparatus that might otherwise transmit vibrations through the site to the isolation frame 4.

The first projection system frame 6 supports an actuator 12 for adjusting the state of a radiation-adjusting element 10 that is part of the projection system PS. The adjustment may consist of changing the position or orientation of the radiation-adjusting element 10, for example. The radiation-adjusting element 10 could be a mirror or a lens, for example.

The second projection system frame 8 supports a sensor 14 for measuring the state of the radiation-adjusting element 10. For example, where the actuator 12 is configured to adjust the position of the radiation-adjusting element 10, the sensor 14 may be configured to measure the position of the radiation-adjusting element 10. The output from the sensor 14 may be used in a control system for controlling the switching of the radiation-adjusting element from a first state to a second state. The control system may use feedback control to control the radiation-adjusting element position, for example. When forces are applied to the radiation-adjusting element 10 by the actuator 12, corresponding reaction forces act on the first projection system frame 6. These reaction forces may cause propagation of vibrations within the first projection system frame 6, particularly at or near natural internal modes of resonance of the projection system frame 6.

Propagation of vibrations out of the first projection system frame 6 into the isolation frame 4 is inhibited by the vibration isolation system 16 but some vibrations may nevertheless pass through. If these vibrations also pass through the vibration isolation system 18 into the second projection system frame 8 they may interfere with the performance of the sensor 14. It is difficult completely to prevent such propagation because the internal structures of the isolation frame 4 and first and second projection system frames 6/8 are more complex than simple models can allow for. As a result it is not possible completely to avoid some overlap between resonant modes of different parts of the system, which can mediate the propagation of vibrations.

The result of such propagation is that there will be two contributions to the output of the sensor 14: 1) a contribution from the changed state of the radiation-adjusting element 10; and 2) a contribution from vibrations caused by actuation of the radiation-adjusting element 10 transmitted through the first projection system frame 6, isolation frame 4 and second projection system frame 8. The second contribution causes errors in the reading of the sensor 14, which can lead to stability problems in the control system that is used for adjusting the radiation-adjusting element 10, which relies on the output of the sensor 14, and/or deviations between the target state of the radiation-adjusting element 10 and the actual state. The output quality and throughput of the lithography process can thus be adversely affected.

The vibration isolation systems 16/18 may be arranged to isolate the projection system frames 6/8 particularly effectively with respect to vibrations associated with actuation of the radiation-adjusting element 10 and/or vibrations which would otherwise interfere most with the control system for carrying out the actuation process. Typically, the most significant vibrations will be of relatively low frequency, for example in the range of 10 Hz to 30 Hz. These frequencies are determined by the stiffness of the resilient members in 16 and 18, in combination with the mass of frames 6 and 8. A low frequency, which results from using a low stiffness, provides a good isolation of vibrations of frame 6 to isolation frame 4, and from isolation frame 4 towards frame 8. In order to provide isolation against such vibrations using a single, continuous resilient member connected at one end to the projection system frame and at the other end to the isolation frame 4, it is necessary to use a resilient member of relatively low stiffness, which will tend to have correspondingly low frequency internal modes of resonance (typically less than 1 kHz, for example in the region of 600 Hz). The internal modes of resonance of such a resilient member are therefore likely to fall relatively close to significant internal modes of resonance of either or both of the projection system frames 6/8, which will tend to increase the extent to which damaging vibrations can propagate from the first projection system frame 6 to the second projection system frame 8.

Figure 3A:
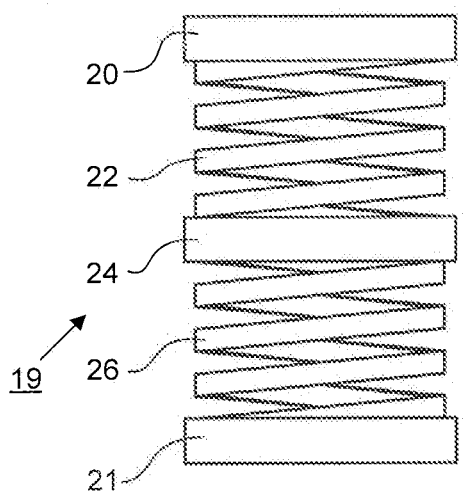
FIGS. 3A and 3B depict, in side view and side sectional view respectively, a resilient portion of a vibration isolation system comprising a first resilient element, a internal mass and a second resilient element in series.
Figure 3B:
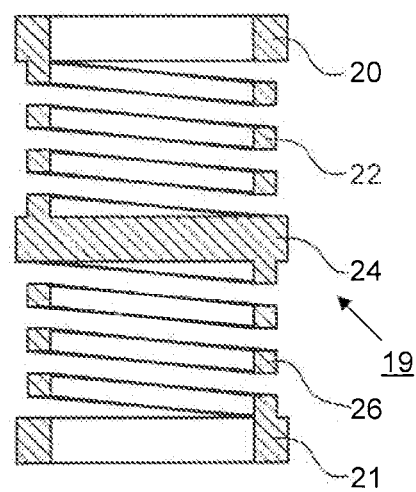

FIGS. 3A and 3B are side and side-sectional views respectively of a resilient portion 19 for a vibration isolation system 16/18 that addresses this issue by incorporating resilient members having higher stiffness. The arrangement also introduces a new resonance mode which further helps to reduce propagation of vibrations between the first and second projection system frames 6/8.

The resilient portion 19 according to this example comprises a first resilient member 22, an internal mass 24 and a second resilient member 26. Connection members 20 and 21 are provided at upper and lower extremities of the resilient portion 19 for respective connection to the first or second projection system frame 6/8 and the isolation frame 4.

A variation on this principle, discussed below with reference to FIG. 11, is where the isolation frame is split into two decoupled units, either or both of which can act as the "internal mass" in a series arrangement consisting of the following three units: 1) the resilient portion of a vibration isolation system acting between one of the two decoupled isolation frames and the projection system frame as the first "resilient member"; 2) the decoupled isolation frame; and 3) the resilient portion of a vibration isolation system acting between the decoupled isolation frame and a base frame as the second "resilient member".

The first and second resilient members 22/24 are resilient in the sense that they are configured to return to an equilibrium size, shape and rotational state after deformation, within certain limits. In operation, the first and second resilient members 22/24 will behave substantially elastically. When deformed from an equilibrium size, shape or rotational state, the first and second resilient members 22/24 will exert a restoring force or torque on the elements causing the deformation, thus providing resistance to deformation. When deployed in an arrangement such as that of FIG. 2 for example, the first and second resilient members 22/24 will exert restoring forces (or torques) on the first and second projection system frames 6 and 8 and the isolation frame 4 when deformed by vibrations in these components.

More specifically, the resilient members 22/24 may be configured to provide resilience (i.e., be substantially elastically deformable) against deformation in one or more of the following six degrees of freedom: compression/extension parallel to the X-, Y- or Z-axes, and rotation about the X-, Y- or Z-axes (Rx, Ry, Rz).

In the arrangement shown, the resilient members 22/24 are formed from elastic material in the form of a spiral having a substantially cylindrical form. The resilient members 22/24 are hollow along the longitudinal axis. The spiral is wound in one of two possible senses: viewed on axis the spiral can be seen to spiral away from the viewer in a clockwise or anticlockwise sense. Other arrangements that provide the required resilient properties could be used additionally or alternatively.

The first resilient member 22, internal mass 24 and second resilient member 26 are arranged to act in series: the first resilient member 22 is connected at one end to the internal mass which is in turn connected to one end of the second resilient member 26, and deformation of the first resilient member 22 causes a corresponding deformation (i.e., a deformation of the same type and in the same sense) of the second resilient member 26 for low frequencies. The other ends of the first and second resilient members 22 and 26 are connected to the connection members 20 and 21.

The use of two or more resilient members 22/26 in series allows stiffer resilient members to be used while providing the same overall stiffness. In the case of two resilient members 22/26 in series, the same overall stiffness as a single resilient member arrangement is achieved using resilient members having twice the original stiffness. The internal resonances of the individual resilient members 22/26 is therefore shifted higher in frequency (above 1 kHz for example), and the extent to which damaging vibrations can propagate from the first projection system frame 6 to the second projection system frame 8 is reduced.

Relative to arrangements using a single resilient member, the resilient portion 19 of FIGS. 3A and 3B also introduces a new natural mode of internal resonance, associated with displacement of the internal mass 24. When deployed in an arrangement such as that of FIG. 2, the new resonance has the effect of changing the frequency response of the lithography system such that propagation of vibrations from the actuator 12 to the sensor 14 is reduced. In essence, without an internal mass 24, any vibrations on interface point 20 will lead to a force acting on interface point 21 by the spring stiffness: $F=c.x$, in which F is the force, c the spring stiffness, and x the vibrational displacement of 20. By inserting the internal mass as in FIGS. 3A and 3B, an extra resonance frequency is introduced that is defined by the mass and the combined stiffness of springs 22 and 26. This extra resonance frequency is positioned at about 150 Hz. Below this new resonance frequency, a vibrational displacement of interface point 20 will again lead to a proportional force on interface point 21. However, above this extra resonance frequency, the internal mass 24 is effectively decoupled from interfaces 20 and 21, i.e., its motion is reduced considerably (quadratically with frequency) in response to motion of interface point 20. Because vibrational motion of mass 24 for frequencies above this extra frequency is much smaller than the vibrational motion of point 20, the force on interface point 21 as a result of vibrations of point 20 becomes much smaller than before.

The stiffnesses of the first and second resilient members 22/26 and the size of the internal mass 24 are chosen so that the frequency of resonance of the combination is spaced apart from other critical frequencies in the construction; critical in the sense that their impact on the transmission from frame 6 to frame 8 is large (e.g., larger than 10%). This spacing apart is needed to avoid amplification of coinciding resonances. The extra frequency should be at least 20 Hz, desirably 50 Hz, more desirably 150 Hz, different from other significant internal modes of the lithography apparatus, for example internal modes of the isolation frame 4, the first projection system frame 6 and the second projection system frame 8. Furthermore, the extra frequency that is the result of the stiffness of the resilient members and the internal mass, should be considerably lower than the lowest frequency in frame 6/8 that could result in problems. For example, if a potential problematic first mode resonance frequency of frame 6/8 is 450 Hz, the internal mass could be selected such that an extra 150 Hz resonance frequency occurs. In that case, an extra factor of 9 reduction of the effect of the 450 Hz resonance can be obtained. In particular, if a 450 Hz vibration of frame 6 would lead to a 10% as large vibration in frame 8, this would be reduced to 1.1%. If both frame 6 and frame 8 make use of the described vibration isolator structure, even a factor of 81 reduction could be obtained.

The frequencies of resonance of the resilient portion 19 may include modes involving displacement and rotation of the internal mass 24 along/about X, Y and Z). Desirably, the resilient portion 19 is configured so that the resonant frequencies of each of the most significant modes of excitation are similar, for example within a frequency range of 25 Hz (desirably within a frequency range of 15 Hz). Desirably, all the frequencies of all of the modes of excitation are arranged to be at least 20 Hz, desirably 50 Hz, different from other significant internal modes of the lithography apparatus, for example internal modes of the isolation frame 4, the first projection system frame 6 and the second projection system frame 8.

The resilient portion 19 shown in FIGS. 3A and 3B comprises first and second resilient members 22 and 26 that are each in the form of a spiral. However, other arrangements that provide the required resilient properties could be used additionally or alternatively.

Figure 4A:
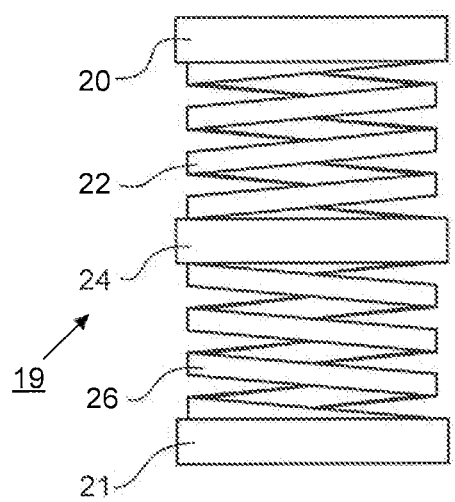
FIGS. 4A and 4B depict, in side view and side sectional view respectively, a resilient portion of a vibration isolation system similar to that of FIGS. 3A and 3B except that the spiral of the first resilient member is wound in the opposite sense to the spiral of the second resilient member.
Figure 4B:
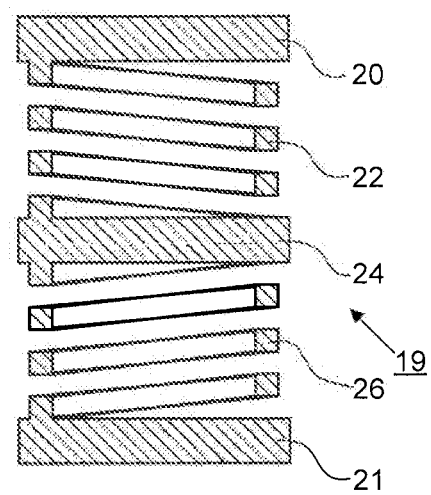

FIGS. 4A and 4B are side and side-sectional views respectively of an alternative example of a resilient portion 19 for a vibration isolation system 16/18. The resilient portion 19 is similar to that depicted in FIGS. 3A and 3B except that the spiral of the first resilient member 22 is wound in the opposite sense to the spiral of the second resilient member 26. This arrangement avoids a force parallel to Z applied to the resilient portion 19 causing a rotation of the internal mass 24 about Z. By reducing the contribution from this possible rotational mode, the spread in frequencies associated with the different internal resonance modes of the resilient member 19 can be reduced, thus reducing the chances of overlap between these resonance modes and others within the system which could otherwise contribute to the propagation of vibrations through the resilient member 19.

Figure 5A:
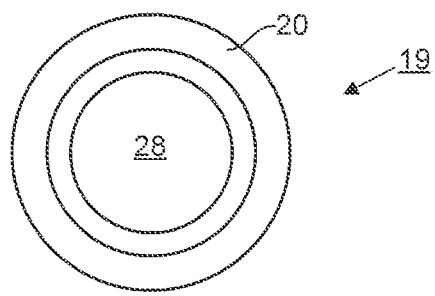
FIGS. 5A and 5B depict, in top view and side sectional view respectively, a resilient portion of a vibration isolation system similar to that of FIGS. 3A and 3B except that the internal mass comprises an interior portion extending longitudinally within the first and second resilient members.
Figure 5B:
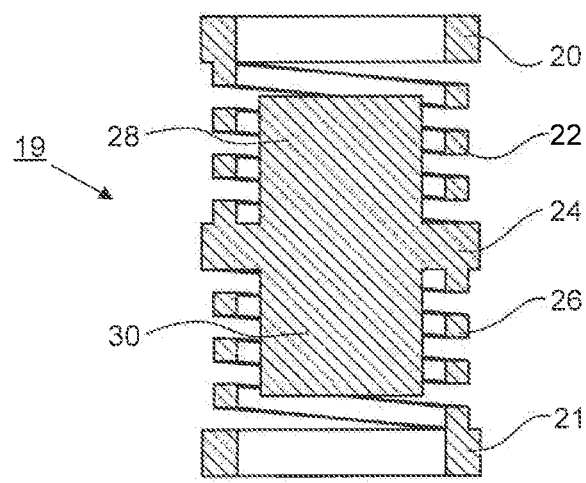

FIGS. 5A and 5B are top and side-sectional views respectively of an alternative example of a resilient portion 19 for a vibration isolation system 16/18. The resilient portion 19 is similar to that depicted in FIGS. 4A and 4B except that the internal mass 24 has an interior portion 28 that extends upwards into the first resilient member 22 and an interior portion 30 that extends downwards into the second resilient member 26. Optionally the interior portions 28/30 extend longitudinally over a total distance (top to bottom) that is at least 25% (desirably at least 50%) of the length of the first resilient member 22 or the second resilient member 26. The interior portions 28/30 of the internal mass 24 are spaced apart from the interior walls of the first or second resilient members 22/26 in such a way that they can move longitudinally, tilt and/or rotate relative thereto, without contact being made. The interior portions 28/30 can therefore accommodate deformation of the resilient portion 19, at least for amplitudes that remain within appropriate limits. Although the arrangement of FIGS. 5A and 5B depicts an internal mass 24 having interior portions 28/30 that extend into both of the first and second resilient members 22/26, it is also possible to arrange for the internal mass 24 to extend into just one of the first and second resilient members 22/26.

The provision of interior portions 28/30 that extend into either or both of the first and second resilient members 22/26 allows the internal mass to be made heavier while maintaining compact overall dimensions for the resilient portion 19.

In this example, the internal mass 24 is circularly symmetric when viewed from above, as can be most easily seen in FIG. 5A. This arrangement again assists with achieving compact overall dimensions, while helping to ensure a response to deformations that is isotropic within the X-Y plane. However, other, non-circularly symmetric arrangements (providing an "anisotropic" response), may be provided instead or in addition, as required. For example, the form of the resilient portion 19, for example the shape of the internal mass 24, could be adapted so as to be non-circularly symmetric. An example is described below with reference to FIGS. 10A and 10B.

Figure 6A:
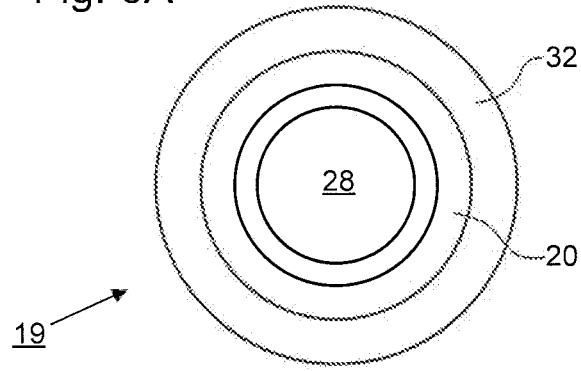
FIGS. 6A and 6B depict, in top view and side sectional view respectively, a resilient portion of a vibration isolation system similar to that of FIGS. 5A and 5B except that the internal mass additionally comprises an exterior portion that extends outside of the first and second resilient members.
Figure 6B:
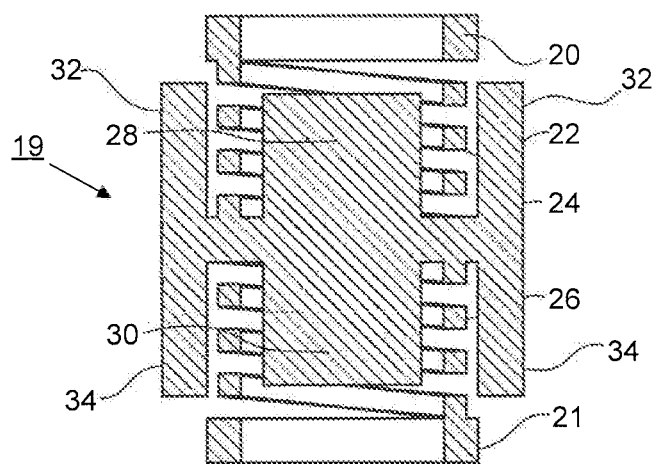

FIGS. 6A and 6B are top and side-sectional views respectively of an alternative example of a resilient portion 19 for a vibration isolation system 16/18. The resilient portion 19 is similar to that depicted in FIGS. 5A and 5B except that in addition to interior portions 28/30 extending into the first and second resilient members 22/26, the internal mass 24 also comprises exterior portions 32 and 34 that are radially outside of the first and second resilient members 22/26 and which extend longitudinally parallel thereto. Alternatively, the exterior portion of the internal mass could be configured to extend to the exterior of the first or second resilient member 22/26 only and/or to extend longitudinally parallel to the first or second resilient member 22/26 only. Optionally, the exterior portions 32/34 extend longitudinally over a total distance (top to bottom) that is at least 25% (desirably at least 50%) of the length of the first resilient member 26.

In the embodiment shown, the exterior portions 32/34 are circularly symmetric, when viewed on axis; they are thus substantially cylindrical in form (except at the points where connection is made to the resilient members 22/24). This form helps to maintain compact overall dimensions and helps to ensure a response to deformations that is isotropic within the X-Y plane. However, arrangements of lower or different symmetry may also be provided.

More generally, providing a portion of the internal mass outside of the resilient members 22/26 increases the range of internal masses that can be used without requiring a corresponding increase in the lateral dimensions of the resilient members 22/24, which helps to reduce costs (by reducing the material required for the resilient members 22/24 and providing the basis for using existing resilient members 22/24 more flexibly). Also, this provides design freedom to create an internal mass that has specific inertias in the three rotational directions, such that the internal resonance frequencies of the corresponding modes is as close as possible to each other.

FIGS. 7A and 7B are top and side-sectional views respectively of a vibration isolation system 16/18 comprising a resilient portion 19 of the type shown in FIGS. 6A and 6B together with a damping portion 40. The damping portion 40 comprises a damping mass 36 and a damping member 38 configured to attach the damping mass 36 to the internal mass 24. The damping member 38 is configured to absorb energy associated with movement of the internal mass 24 and therefore damp vibrations of the resilient portion 19. In the embodiment shown, the damping portion 40 is circularly symmetric to ensure compactness and an isotropic response to deformations, but other configurations may also be used without departing from the underlying concept.

In the embodiments illustrated in FIGS. 3A to 7B, the various resilient portions 19 are arranged to have a response to deformations that is circularly symmetric within the X-Y plane. However, as mentioned above, it may be desirable to provide resilient portions 19 that respond in a less symmetric way (i.e., anisotropically). For example, a combination of such resilient portions 19 can be used to reduce the spread in frequency between different modes of resonance of a projection system frame 6/8 (e.g., between vibrations parallel to X, Y and Z and/or rotations about X, Y and/or Z). The combination can also be used to isolate particular modes of resonance more effectively from the isolation frame 4 and, thus, other projection system frames.

FIG. 8 is a schematic top view of a projection system frame 6/8 and three anisotropic resilient portions 19 illustrating this principle. Each of the anisotropic resilient portions 19 is configured to have a stiffness that is larger parallel to a first axis (illustrated schematically by the long axis of the rectangle representing the resilient member 19) than parallel to a second axis (illustrated schematically by the short axis). In this example, each of the resilient portions 19 is positioned towards the periphery of the projection system frame 6/8 (desirably so as to act on the projection system frame 16/18 at a position that is nearer to a lateral edge of the projection system frame 6/8 than to the center of mass of the projection system frame 6/8). Optionally, one or more of the resilient portions 19 is configured to overlap a lateral edge of the projection system frame 6/8. Each of the resilient portions 19 is oriented so that the first axis is directed towards the center of mass of the projection system frame 6/8 (i.e., generally inwards). Optionally, the first axis makes an angle with a line joining the center of the area over which the resilient member 19 acts on the projection system frame 6/8 to the center of mass of the projection system frame of less than 45 degrees, desirably less than 30 degrees or less than 10 degrees. In an actual lithographic machine, the choice of location at which the frame 6/8 is connected to isolation frame 4 is very limited, because of the presence of many components in the machine, and the fact that light has to pass through the projection optics system. At a given mass of the frames 6/8, selecting an equal total stiffness of the combination of resilient members 19 in X, Y and Z direction results in equal resonance frequencies of the frame in these directions (e.g., between 10 and 30 Hz). However, for a given set of three locations connected to the frame 6/8, the inertias in Rx, Ry and Rz directions are different. To create nearly equal resonance frequencies in these rotational directions, the stiffness of the individual resilient members 19 in X, Y and Z directions, can be selected differently (as long as the total stiffness of all resilient members together is the same in X, Y and Z directions). For example, the inertia with respect to Rz is typically smaller than the inertia with respect to Rx and Ry, so it would be beneficial to arrange for the stiffness of the resilient members 19 in a tangential direction with respect to Rz to be lower than the stiffness of the resilient members 19 in other directions.

FIGS. 9A and 9B are side and side-sectional views of a dual-series, anisotropic resilient portion 19 of a vibration isolation system 16/18. In this arrangement, two pairs of resilient members are provided: first and second resilient members 22 and 26 (on the left) and third and fourth resilient members 42 and 44 (on the right). However, it is also possible to provide one parallel pair of resilient members in series with a single resilient member (i.e., a three resilient member arrangement). The first and second resilient members 22 and 26 are configured to act in series, with an internal mass 24 attached between them. Similarly, the third and fourth resilient members 42 and 44 are configured to act in series, with a second internal mass 24 attached between them. In the example shown, the first and second internal masses 24 are connected integrally together to form a single mass; however, separate masses could be used instead, optionally spaced apart from each other so as to be able to move or twist independently. The series first resilient member-internal mass-second resilient member (elements 22-24-26) is arranged to act in parallel with the series third resilient member-second internal mass-second resilient member (elements 42-24-44). The stiffness of the resulting resilient member 19 is larger with respect to deformations which act horizontally in the plane of the page, as illustrated, than with respect to deformations that act horizontally perpendicular to the plane of the page. This anisotropy could therefore be used for reducing the spread of resonance frequencies of either or both of the projection system frames 6/8 in a configuration such as that shown in FIG. 8, for example.

Optionally, the first, second, third and fourth resilient members 22/26/42/44 comprise elastic material in the form of a spiral. Further optionally (as shown), the spiral of the first resilient member 22 is wound in the opposite sense to the spiral of the second resilient member 26 and/or the spiral of the third resilient member 42 is wound in the opposite sense to the spiral of the fourth resilient member 44. This reduces the extent to which forces parallel to Z can cause rotations about Z and reduces the spread of frequencies associated with internal resonances of the resilient member 19. Further optionally (as shown), the spiral of the first resilient member 22 is wound in the opposite sense to the spiral of the third resilient member 42 (the resilient member that is at the same level as the first resilient member 22). This further improves the suppression of rotations about the Z-axis. In addition, the arrangement provides for further anisotropy in the rotational stiffness of the resilient member, with increased stiffness with respect to rotations about the horizontal axis within the page, as illustrated, relative to the stiffness with respect to rotations about the horizontal axis perpendicular to the page. This further anisotropy provides greater scope for reducing the spread of frequencies associated with significant resonances of either or both of the projection system frames 6/8 when appropriately supported by a combination of such resilient members 19.

FIGS. 10A and 10B are top and side-sectional views of a further anisotropic resilient portion 19 of a vibration isolation system 16/18. The depicted arrangement is similar to that shown in FIGS. 9A and 9B except that the first and second internal masses 24 (which are configured as a single interior unit in this example) are configured to extend longitudinally within the first, second, third and fourth resilient members 22/26/42/44 (interior portion 28/30) and to the exterior of the first, second, third and fourth resilient members 22/26/42/44 (exterior portion 32/34). The exterior portion 32/34 of the internal mass 24 is further arranged to have a rectangular form with the two series of resilient members aligned with the long axis. The resulting arrangement allows for a wide range of internal masses to be used while maintaining highly compact external dimensions, particularly parallel to the short axis.

An alternative or additional approach for reducing propagation of vibrations from the first projection system frame 6 to the second projection system frame 8 is to provide an extra stage of isolation. One way in which this can be achieved is by splitting the isolation frame into two frames that are isolated from each other. This approach can be used with, or instead of, any of the other arrangements disclosed to further improve the isolation of the first projection system frame 6 from the second projection system frame 8.

FIG. 11 shows an exemplary embodiment based on this concept. According to this arrangement, the first projection system frame 6 is supported by a first isolation frame 4A and the second projection system frame 8 is supported by a second isolation frame 4B. Vibration isolation systems 16/18 are provided between the first isolation frame 4A and the first projection system frame 6 and between the second isolation frame 4B and the second projection system frame 8. The first and second isolation frames 4A/4B are not rigidly or integrally connected to each other, and are each separated from the base frame 2 by vibration isolation systems 17A/B. No direct mechanical connection is therefore present between the vibration isolation systems 16/18, in contrast to the situation in the arrangement of FIG. 2 where the single isolation frame 4 provides such a connection.

The arrangement of FIG. 11 implements the concept of using a vibration isolation system consisting of a series of first resilient member-internal mass-second resilient member. In particular, two such vibration isolation systems can be identified: 1) the combination of the resilient portion of the vibration isolation system 16, the isolation frame 4A (as the internal mass) and the resilient portion of the vibration isolation system 17A; and 2) the combination of the resilient portion of the vibration isolation system 18, the isolation frame 4B (as the internal mass) and the resilient portion of the vibration isolation system 17B. The inhibition of propagation of vibrations from the first projection system frame 6 to the second projection system 8 via the base frame 2 is thus reduced by means of the same mechanism (described above in detail) that inhibits propagation of vibrations between the first and second projection system frames 6/8 via the single isolation frame 4 in the configuration of FIG. 2 in the case where the vibration isolation systems 16 and 18 are each formed so as to comprise internal masses. In particular, the same additional resonance mode is created which helps to decouple the first and second projection system frames 6/8 from the rest of the system.

In addition to the benefit obtained from splitting the isolation frame in this way, further inhibition of vibration propagation can be obtained by using a series arrangement based on the same principle (resilient member-internal mass-resilient member) in between the first projection system frame 6 and the first isolation frame 4A and/or in between the second projection system frame 8 and the second isolation frame 4A. For example, any one of the embodiments discussed above with reference to FIGS. 3A to 10B could be used in these positions.

A sensor 50 is provided for measuring the separation between the first and second isolation frames 4A/4B. The output from the sensor 50 is fed to a control system 46 which outputs a control signal to an isolation frame actuator 52 provided on the base frame 2. The actuator 52 responds to the control signal by varying a force applied to the first isolation frame 4A in order to keep the separation between the first and second isolation frames 4A/4B within a tolerance margin of a target value. Alternatively or additionally, the first or second projection system frame 6/8 may be provided with a sensor 48 for measuring the distance between the first and second projection system frames 6/8 and the control system 46 may be configured to use this value to control the operation of the actuator 52 to keep the separation between the first and second projection system frames 6/8 within a tolerance margin of a target value.

The extra level of isolation provided by splitting the isolation frame in this way reduces the extent to which vibrations originating in the first projection system frame 6 can propagate through to the second projection system frame 8. The provision of a control system ensures that the spatial relationship between the first and second projection system frames 6/8 is kept constant to within acceptable limits. The accuracy and/or stability of the lithography apparatus is therefore improved.

An alternative approach for reducing propagation of vibrations from the first projection system frame 6 to the second projection system frame 8 is to reconfigure the way how the isolation frame 4 is arranged with respect to the first and/or second projection system frames 6/8. One way in which this can be achieved is by providing the first and second projection frames 6, 8 with a first vibration isolation system 17A while providing the isolation frame 4 with a second vibration isolation system 17B. An advantage of a configuration wherein the isolation frame 4 is no longer supporting the first and second projection frames 6, 8 is that the size of the isolation frame 4 can be reduced in comparison with a conventional layout. This might result in increased internal frequencies of the isolation frame 4 which is beneficial as e.g. the stage positioning system is coupled to that isolation frame 4.

FIG. 12 shows an exemplary embodiment based on this concept. According to this arrangement, the first projection system frame 6 and the second projection system frame 8 are supported on the base frame 2 via a first vibration isolation system 17A. The isolation frame 4 is supported on the base frame 2 via a second vibration isolation system 17B. The first projection system frame 6 and the second projection system frame 8 are not rigidly connected to each other, but are connected via a vibration isolation system 16. The first projection system frame 6 supports a reaction mass 60 via resilient member 62. An actuator 12 for adjusting the state of the radiation-adjusting element 10 is connected to the first projection system frame 6 via the reaction mass 60 such that driving forces of actuator 12 above a certain frequency are filtered which may result in less excitation of the of e.g. the first projection system frame 6. As an example, the stiffness of resilient member 62 may be adapted in such a way that the dynamic system formed by actuator 12, reaction mass 60 and resilient member 62 filters above a frequency of 10 Hz. Sensor 14 may be configured to measure the position of the radiation-adjusting element 10 with respect to the second projection system frame 8. A sensor 64, for example an interferometer, is provided to measure the position between the isolation frame 4 and the second projection system frame 8 while a controller is configured to compensate based on the relative position between the isolation frame 4 and the second projection system frame 8.

An alternative or additional approach for reducing propagation of vibrations from the first projection system frame 6 to the second projection system frame 8 is to reconfigure the way the isolation frame 4 connects to the first and/or second projection system frames 6/8. In general, there are advantages associated with providing a connection between an isolation frame and a projection system frame at a height which is close to the center of mass of the projection system frame. For example, this approach helps to minimize the spread of frequencies associated with different modes of resonance of the projection system frame. However, the resulting large separation between the center of mass of the isolation frame and the point of connection between the isolation frame and projection system frame means that for a given component of force parallel to the X-Y plane acting between the projection system frame and the isolation frame, a relatively large torque is applied about an axis within the X-Y plane, which can result in a large force being transmitted to other projection system frames that are supported by the same isolation frame. This effect can tend to increase the extent to which vibrations can propagate between one projection system frame and another.

FIG. 13A is a schematic depiction of such a situation. Here, the projection system frame 6/8 is configured to interact with the isolation frame 4 that supports it at interaction point 54. For example, a vibration isolation system may be deployed at the interaction point 54. The interaction point 54 is elevated relative to the isolation frame 4 so as to be at or near the height of the center of mass of the projection system frame 6/8.

FIG. 13B is a schematic illustration of an alternative arrangement where the interaction point 54 is lowered, thus reducing the sizes of torques applied to the isolation frame 4 and reducing the extent to which vibrations originating in the projection system frame 6/8 are transmitted though the isolation frame 4 to other projection system frames (supported by the same isolation frame 4, for example, where a single isolation frame is provided, or supported by a different isolation frame where different projection system frames are supported by distinct isolation frames, in the manner of FIG. 11).

Desirably, the separation between the connection point 54 and the horizontal plane containing the center of mass of the projection system frame 6/8 is at least 5 times greater than the separation between the connection point 54 and the horizontal plane containing the center of mass of the isolation frame 4. More desirably, the separation is 10 times greater or 20 times greater.

The concept underlying the arrangement of FIG. 13B can be used instead of or in addition to any of the embodiments discussed above. For example, any of the various disclosed configurations for the vibration isolation system 16/18 could be deployed at the interaction point 54. The lowered interaction point 54 could be used in conjunction with either or both of the first and second projection system frames 6/8 and/or with other frames. Where a plurality of isolation frames 4A/4B are provided, as in arrangements of the type shown in FIG. 11, the approach of FIG. 13B could be used in conjunction with either or both of the isolation frames 4A/4B.

According to an embodiment, there is provided that a resilient portion of the second vibration isolation system comprises the first resilient member, the first isolation frame comprises the first internal mass and the fourth vibration isolation system comprises the second resilient member.

In an embodiment at least one of the second and third vibration isolation systems comprises the first vibration isolation system.

In an embodiment the fourth and fifth vibration isolation systems comprise air mounts.

In an embodiment, there is further provided a sensor configured to measure the separation between the first and second isolation frames, an actuator configured to apply a force to one of the first and second isolation frames and a control system configured to control the relative separation of the first and second isolation frames using the sensor and the actuator.

In an embodiment, there is further provided a sensor configured to measure the separation between the first and second projection system frames, an actuator configured to apply a force to one of the first and second isolation frames and a control system configured to control the relative separation of the first and second projection system frames using the sensor and the actuator.

In an embodiment the first vibration isolation system is configured to act between the second projection system frame and the isolation frame.

In an embodiment a damping mass is connected to the exterior portion via a damping member.

According to an embodiment, there is provided that the anisotropic resilient portions are oriented such that the first vibration isolation system provides a lowest stiffness with respect to deformation modes associated with the lowest inertia of the projection system frame with which the first vibration isolation system is in contact.

In an embodiment each of the plurality of resilient portions has a stiffness with respect to deformation parallel to a first axis within a plane parallel to that of the substrate in use that is higher than with respect to deformation parallel to a second axis, perpendicular to the first axis and within the same plane and each of the plurality of resilient portions is oriented such that the first axis makes an angle of less than 45 degrees with a line joining the center of the area over which the resilient portion acts on the projection system frame with which it is in contact to the center of mass of the projection system frame with which it is in contact.

In an embodiment, the resilient portion of the first vibration isolation system further comprises a second internal mass and a fourth resilient member, the third resilient member, second internal mass and fourth resilient member being arranged respectively in series; and the series of first resilient member, first internal mass and second resilient member is arranged to act in parallel with the series of third resilient member, second internal mass and fourth resilient member.

In an embodiment, the spiral of the first resilient member is wound in the opposite sense to the spiral of the second resilient member.

In an embodiment, the first resilient member is laterally aligned with the third resilient member and the second resilient member is laterally aligned with the fourth resilient member.

In an embodiment, the third resilient member and the fourth resilient member are each formed from an elastic material in the form of a spiral and the spiral of the first resilient member is wound in the opposite sense to the spiral of the third resilient member, and the spiral of the second resilient member is wound in the opposite sense to the spiral of the fourth resilient member.

In an embodiment, the first internal mass is integrally formed with the second internal mass.

In an embodiment, the first, second, third and fourth resilient members are each formed from an elastic material in the form of a spiral and the first and second internal masses comprise an exterior portion that is located radially outside of the first, second, third and fourth resilient members and is configured to form a continuous closed loop surrounding the first, second, third and fourth resilient members in a plane parallel to that of the substrate in use.

In an embodiment, the first resilient member and second resilient member are aligned along a first axis and the third resilient member and the fourth resilient member are aligned along a second axis, parallel to the first axis and spaced apart laterally therefrom.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the present invention in the context of optical lithography, it will be appreciated that the present invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the present invention have been described above, it will be appreciated that the present invention may be practiced otherwise than as described. For example, the present invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the present invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A lithography apparatus comprising:
    a projection system comprising first and second portions;
    first and second vibration isolation systems;
    a first projection system frame configured to support the first portion;
    a second projection system frame configured to support the second portion; and
    a base frame configured to support the first projection system frame via the first vibration isolation system;
    wherein the first vibration isolation system is configured to reduce vibrations between the first projection system frame and the base frame, and wherein the second vibration isolation system is configured to reduce vibrations between the first projection system frame and the second projection system frame.

2. The lithographic apparatus of claim 1, wherein:
the first vibration isolation system comprises a first resilient portion, and
the first resilient portion comprises a first resilient member, a first internal mass, and a second resilient member.

3. The lithographic apparatus of claim 2, wherein:
the second vibration isolation system comprises a second resilient portion, and
the second resilient portion comprises a third resilient member, a second internal mass, and a fourth resilient member.

4. The lithographic apparatus of claim 1, wherein the projection system further comprises:
a radiation-adjusting element configured to adjust a property of a patterned radiation beam, and
an actuator configured to adjust a state of the radiation-adjusting element.

5. The lithographic apparatus of claim 4, the projection system further comprising a sensor configured to measure a state of the radiation-adjusting element.

6. The lithographic apparatus of claim 1, further comprising:
an isolation frame; and
a third vibration isolation system,
wherein the base frame is configured to support the isolation frame via the third vibration isolation system, and
wherein the third vibration isolation system is configured to reduce vibrations from the base frame to the isolation frame.

7. The lithographic apparatus of claim 6, further comprising a sensor mounted to the isolation frame and configured to measure a relative position between the isolation frame and the second projection system frame.

8. The lithographic apparatus of claim 7, wherein the sensor comprises an interferometer.

9. The lithographic apparatus of claim 1, further comprising a reaction mass supported by the first projection system frame via a resilient member.

10. The lithographic apparatus of claim 1, further comprising:
a sensor configured to measure a separation between the first and second isolation frames;
an actuator configured to apply a force to at least one of the first and second isolation frames; and
a control system configured to control the separation of the first and second isolation frames using the sensor and the actuator.

11. The lithography apparatus according claim 1, wherein the first vibration isolation system further comprises a damping portion configured to absorb energy associated with deformation of the resilient portion.

12. The lithography apparatus according claim 1, wherein the first vibration isolation system comprises:
a plurality of resilient portions each arranged to have an anisotropic stiffness and positioned so as to reduce spread in resonant frequencies associated with at least one of three rotational degrees of freedom and three translation degrees of freedom of the projection system frame with which the first vibration system is in contact.

13. The lithography apparatus of claim 1, wherein the first vibration isolation system further comprises:
a damping portion configured to absorb energy associated with deformation of the resilient portion, the damping portion comprising a damping mass attached via a damping member to the first internal mass.

14. A lithography apparatus, comprising:
first and second projection system frames;
an isolation frame; and
a base frame configured to support the first projection system frame using a first vibration isolation system,
wherein the first projection system frame is configured to support the second projection system frame using a second vibration isolation system, and
wherein the first and the second projection system frames are connected to the isolation frame at a height from the base frame that is substantially close to either a first center of mass of the first and the second projection system frames or to a second center of mass of one of the first and the second projection system frames.

15. The lithography apparatus of claim 14, wherein the base frame is further configured to support the isolation frame via a third vibration isolation system.

16. The lithography apparatus of claim 14, further comprising a reaction mass and a resilient member, wherein the first projection system frame supports the reaction mass using the resilient member.

17. The lithography apparatus of claim 16, further comprising an actuator connected to the reaction mass and configured to adjust a state of a radiation-adjusting element.

18. The lithography apparatus of claim 17, further comprising a dynamic system formed by the actuator, the reaction mass, and the resilient member, the dynamic system being configured to filter driving forces of the actuator above a first frequency.

19. The lithography apparatus of claim 18, wherein the first frequency is 10 Hz.

20. A lithography apparatus, comprising:
first and second projection system frames;
an isolation frame;
a base frame configured to support the first projection system frame using a first vibration isolation system; and
wherein the first projection system frame is configured to support the second projection system frame using a second vibration isolation system,
wherein the base frame is further configured to support the isolation frame via a third vibration isolation system, and
wherein the first and the second projection system frames are connected to the isolation frame at a height from the base frame that is substantially close to a first center of mass of the first and the second projection system frames or to a second center of mass of one of the first and the second projection system frames.

* * * * *